(12) United States Patent
Taylor, Jr.

(10) Patent No.: US 11,543,604 B2
(45) Date of Patent: Jan. 3, 2023

(54) ON-CHIP HEATER WITH A HEATING ELEMENT THAT LOCALLY GENERATES DIFFERENT AMOUNTS OF HEAT AND METHODS

(71) Applicant: GLOBALFOUNDRIES U.S. Inc., Malta, NY (US)

(72) Inventor: William J. Taylor, Jr., Clifton Park, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 43 days.

(21) Appl. No.: 17/223,059

(22) Filed: Apr. 6, 2021

(65) Prior Publication Data
US 2022/0317393 A1  Oct. 6, 2022

(51) Int. Cl.
G02B 6/42  (2006.01)

(52) U.S. Cl.
CPC .................. *G02B 6/4266* (2013.01)

(58) Field of Classification Search
CPC ................................................ G02B 6/4266
See application file for complete search history.

(56) References Cited

U.S. PATENT DOCUMENTS

| 10,162,199 | B2 * | 12/2018 | Zheng | H01S 5/50 |
| 10,372,014 | B1 * | 8/2019 | Vidrighin | G02F 1/3536 |
| 2004/0196334 | A1 | 10/2004 | Cornell | |
| 2014/0242329 | A1 * | 8/2014 | Banaei | B29C 55/22 |
| | | | | 72/364 |
| 2016/0103055 | A1 * | 4/2016 | Gaertner | F01N 11/00 |
| | | | | 73/23.31 |
| 2018/0152989 | A1 * | 5/2018 | Holoubek | H05B 3/0014 |
| 2020/0323039 | A1 * | 10/2020 | Wallinger | H05B 3/26 |

OTHER PUBLICATIONS

Dong et al., "Thermally Tunable Silicon Racetrack Resonators with Ultralow Tuning Power", Optics Express 20298, vol. 18, No. 19, 2010, pp. 1-7.

(Continued)

*Primary Examiner* — Ellen E Kim
(74) *Attorney, Agent, or Firm* — Anthony Canale; Hoffman Warnick LLC

(57) ABSTRACT

Disclosed is a chip structure that includes heater. The heater includes a heating element with a first end and a second end and, between the first and second ends, different portions with different cross-sectional areas. The heating element further includes first and second terminals at the first and second ends, respectively. Current flowing through the heating element between the first and second terminals causes the heating element to generate heat. However, due to the different cross-sectional areas of the different portions, the current densities through those different portions are different and, thus, the different portions of the heating element generate different amounts of heat per unit length. The heating element can be designed and placed on-chip to facilitate local thermal tuning of different regions of a device or of different devices without requiring multiple different heating elements within a relatively small chip area. Also disclosed is an associated method.

15 Claims, 9 Drawing Sheets

(56) References Cited

OTHER PUBLICATIONS

Konoike et al., "Ultra-Compact Silicon Photonics Switch with High-Density Thermo-Optic Heaters", Optics Express, vol. 27, No. 7, 2019, pp. 10332-103342.
Manganelli et al., "Large-FSR Thermally Tunable Double-Ring Filters for WDM Applications in Silicon Photonics", IEEE Photonics Journal, vol. 9, No. 1, 2017, pp. 1-11.
Masood et al., "Comparison of Heater Architectures for Thermal Control of Silicon Photonic Circuits", IEEE, 2013, pp. 83-84.
Atabaki et al., "Optimization of Metallic Microheaters for High-Speed Reconfigurable Silicon Photonics", Optical Society of America, Optics Express vol. 18, No. 17, 2010, pp. 18312-18323.
Bahadori et al., "Nonlinear Temperature-Dependent Transfer Characteristics of Silicon Photonic Microring Resonators", Advanced Photonics, OSA, 2015, pp. 1-3.
Li et al., "High-Efficiency 25Gb/s CMOS Ring Modulator with Integrated Thermal Tuning", ResarchGate, 2011, pp. 1-4.
Li et al., "Compact Design of an Optical Phase Shifter Packaged with IST Microheater used for Integrated Photonics", Results in Physics 19, 103644, 2020, pp. 1-8.
Saeedi et al., "Silicon-Photonic PTAT Temperature Sensor for Micro-Ring Resonator Thermal Stabilization", Optical Society of America, Optics Express, vol. 23, No. 17, 2015, pp. 1-10.
Wu et al., "A 130 GHz Electro-Optic Ring Modulator with Double-Layer Graphene", Crystals, vol. 7. No. 65, 2017, pp. 1-10.
Zortman et al., "Integrated 10Gbps Silicon Photonic Heater-Modulator", United States, 2011, pp. 1-10, https://www.osti.gov/servlets/purl/1118718.
Xu, Qianfan, "Silicon Dual-Ring Modulator", Optical Society of America, Optics Express, vol. 17, No. 23, 2009, pp. 20783-20793.

* cited by examiner

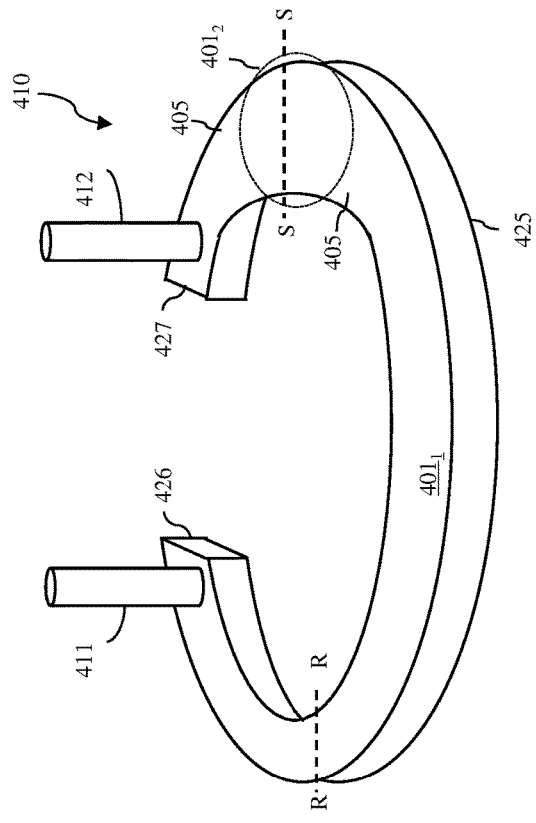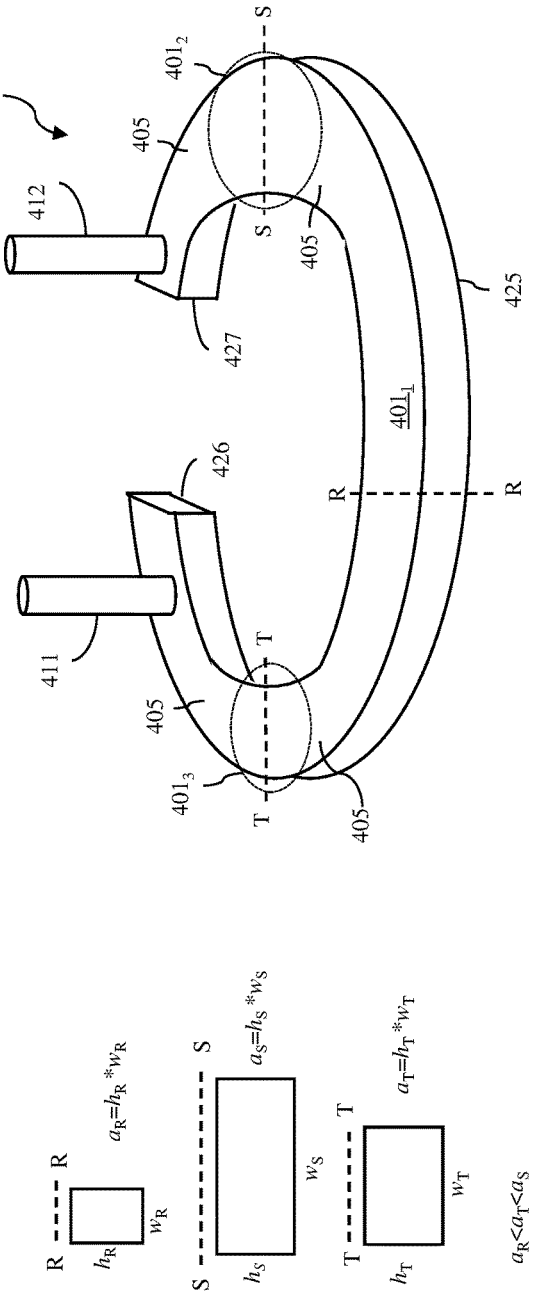
FIG. 4A
FIG. 4B

ON-CHIP HEATER WITH A HEATING ELEMENT THAT LOCALLY GENERATES DIFFERENT AMOUNTS OF HEAT AND METHODS

BACKGROUND

Field of the Invention

The present invention relates to on-chip heaters and the chip structures that incorporate them and, more particularly, to embodiments of an on-chip heater configured to locally generate different amounts of heat (i.e., to generate different amounts of heat at different locations), to embodiments of a chip structure that incorporates such a heater, and to associated method embodiments.

Description of Related Art

On-chip heaters are often employed to achieve desired temperature profiles in other on-chip components. For example, in on-chip optoelectronic circuits, some photonic devices (including, but not limited to, optical resonators and phase-shifters) require thermal tuning. For example, an optical resonator may be thermally tuned using a heater to avoid temperature-dependent resonance wavelength variations and thereby frequency response variations. An optical phase-shifter may be thermally tuned using a heater to ensure that a desired phase shift is achieved. However, as chip size continues to be scaled and device density continues to be increased, it has become increasingly difficult to provide adequate heaters for such thermal tuning.

SUMMARY

Generally, disclosed herein are embodiments of a chip structure that includes a heater configured to locally generate different amounts of heat (i.e., to generate different amounts of heat at different locations). Specifically, the heater includes a heating element with a first end and a second end and, between the first end and the second end, different portions with different cross-sectional areas. The heater can further include a first terminal at the first end of the heating element and configured to receive a first voltage and a second terminal at the second end of the heating element and configured to receive a second voltage that is different from the first voltage so that current flows through the heating element from end to end. Current flowing through the heating element causes the heating element to generate heat. However, due to the different cross-sectional areas of the different portions, the current densities through those different portions are different and, thus, the different portions of the heating element generate different amounts of heat per unit length.

Such a heater and, particularly, the heating element thereof can be designed and placed on-chip to facilitate local thermal tuning of adjacent areas of the chip (e.g., different regions of a single device or different devices) without requiring multiple different heaters within a relatively small chip area. More specifically, in some embodiments, the chip structure can further include a device that requires thermal tuning. The heater can be adjacent to the device. In this case, the different portions of the heating element can be aligned with different regions of the device. Due to placement of the heating element relative to the device and, particularly, due to alignment of the different portions of the heating element with the different regions of the device, different amounts of heat can be applied to the different regions of the device, thereby raising the temperatures of those different regions by different amounts. In other embodiments, the chip structure can include multiple devices that require thermal tuning and the heater can be adjacent to two or more of those devices. In this case, the different portions of the heating element can be aligned with different devices. Due to placement of the heating element relative to the devices and, particularly, due to alignment of the different portions of the heating element with the different devices, different amounts of heat can be applied to the different devices, thereby raising the temperatures of the different devices by different amounts.

Also disclosed herein are method embodiments associated with the above-described structures. The method embodiments can include providing a chip structure, which includes a heater configured to locally generate different amounts of heat (i.e., to generate different amounts of heat at different locations). Specifically, as discussed above, the heater can include a heating element with a first end and a second end and, between the first end and the second end, different portions with different cross-sectional areas. The heater can further include a first terminal at the first end of the heating element and a second terminal at the second end of the heating element. The method embodiments can further include generating heat using the heater. Generating heat using the heater can include applying a first voltage to the first terminal and a second voltage, which is different from the first voltage, to the second terminal so as to cause current to flow through the heating element from end to end. Current flowing through the heating element causes the heating element to generate heat. However, due to the different cross-sectional areas of the different portions, the current densities through those different portions are different and, thus, the different portions of the heating element generate different amounts of heat per unit length. The method embodiments can include designing such heater (and, particularly, the heating element thereof) and manufacturing it on a chip in order to facilitate local thermal tuning of adjacent areas of the chip (e.g., different regions of a single device or different devices) without requiring multiple different heaters within a relatively small chip area.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 4A and 4B are perspective drawings illustrating alternative structures, respectively, of a heater according to embodiments disclosed herein, wherein the heater has an essentially ring-shaped on-chip heating element;

DETAILED DESCRIPTION

Figure 1:
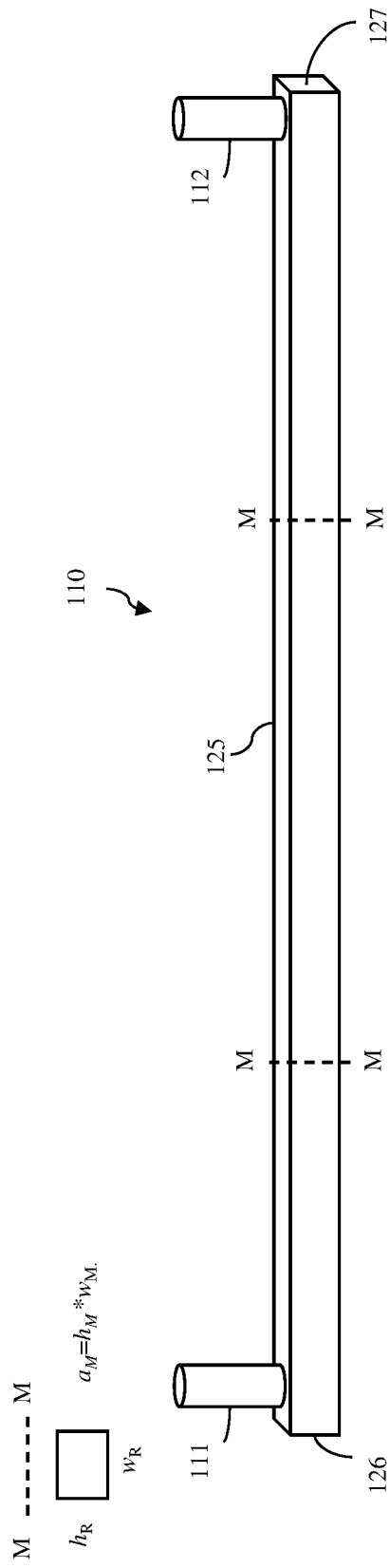
FIGS. 1 and 2 are perspective drawings illustrating conventional on-chip heaters.
Figure 2:
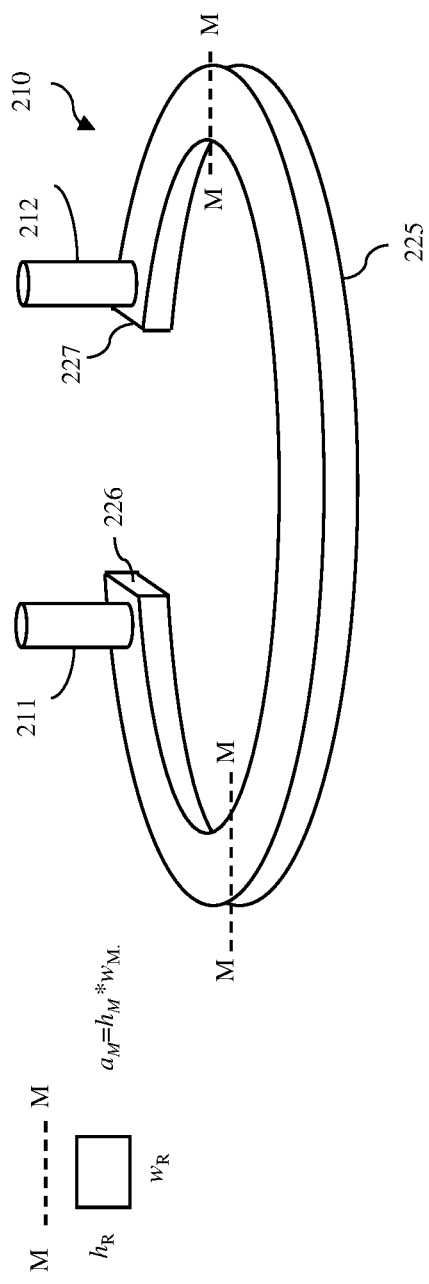

As mentioned above, on-chip heaters are often employed to achieve desired temperature profiles in other on-chip components. For example, in on-chip optoelectronic circuits, some photonic devices (including, but not limited to, resonators and phase-shifters) require thermal tuning. FIGS. 1 and 2 are perspective drawings illustrating conventional on-chip heaters 110, 210. Each heater 110, 210 includes a heating element 125, 225. As illustrated, heating elements 125 and 225 can vary in shape. For example, the heating element 125 of FIG. 1 is an essentially linear heating element, whereas the heating element 225 of FIG. 2 is an essentially ring-shaped heating element. Regardless of the general shape, the heating element 125, 225 is an elongated structure with a first end 126, 226 and a second end 127, 227. The cross-sectional area of the heating element 125, 225 is essentially the same across its full length. That is, the cross-sectional area$_M$ ($a_M$) at any point MM along the length of the heating element 125, 225 is essentially the same and equal to the height$_M$ ($h_M$) of the heating element 125, 225 times the width$_M$ ($w_M$) of the heating element. The heater 110, 210 can further include a first terminal 111, 211 at the first end 126, 226 of the heating element 125, 225 and a second terminal 112, 212 at the second end 127, 227 of the heating element 125, 225. Different voltages applied to the terminals results in current flow through the heating element and current flow through the heating element 125, 225 causes the heating element 125, 225 to generate the same amount of heat per unit length across its full length.

Unfortunately, as chip size continues to be scaled and device density continues to be increased, it has become increasingly difficult to provide adequate heaters for thermal tuning. Specifically, thermal tuning typically involves the use of a heater to raise the temperature of a device or devices to some predetermined temperature. For example, the goal of thermal tuning of an optical resonator can be to raise the temperature of a ring-shaped waveguide to some predetermined temperature in order to achieve a desired frequency response. In this case, a heater with a ring-shaped heating element, such as the heater 210 with the ring-shaped heating element 225 shown in FIG. 2, is aligned above and in close proximity to the ring-shaped waveguide. A predetermined voltage differential is applied between the terminals 211-212 so that a predetermined amount of electric current flows through the heating element 225 and, thus, so that a predetermined amount of heat per unit length is generated across the full length of the heating element. Given the placement of the heating element relative to the waveguide, the heat generated by heating element is applied to the waveguide and the temperature of the waveguide is uniformly raised (i.e., raised by the same amount across the waveguide). However, with increases in device density, local temperature variations can be present within the waveguide prior to thermal tuning (e.g., due to placement adjacent to other on-chip devices, such as other ring-shaped waveguides within the optical resonator). With the heating element 225, such temperature variations would still be present postthermal tuning. That is, given these local temperature variations, raising the temperature across the waveguide by the same amount will not achieve a uniform temperature distribution across the waveguide.

In view of the foregoing, disclosed herein are embodiments of a chip structure that includes a heater. The heater includes a heating element with a first end and a second end and, between the first end and the second end, different portions with different cross-sectional areas. The heater further includes a first terminal at the first end of the heating element and a second terminal at the second end of the heating element. Different voltages applied to the terminals results in current flow through the heating element. Current flowing through the heating element causes the heating element to generate heat. However, due to the different cross-sectional areas of the different portions, the current densities through those different portions are different and, thus, the different portions of the heating element generate different amounts of heat per unit length. The heater and, particularly, the heating element thereof can be designed and placed on-chip to facilitate local thermal tuning of adjacent areas of the chip (e.g., different regions of a single device or different devices) without requiring multiple different heaters within a relatively small chip area. Also disclosed are associated method embodiments.

Figure 3A:
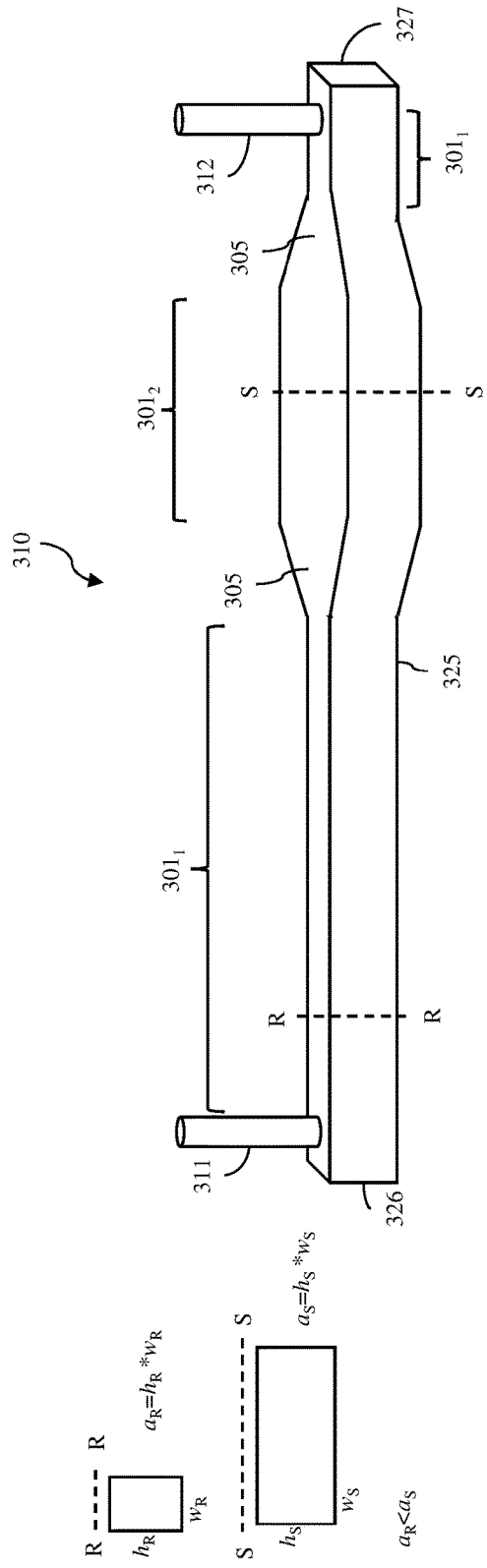
FIGS. 3A and 3B are perspective drawings illustrating alternative structures, respectively, of a heater according to embodiments disclosed herein, wherein the heater has an essentially linear heater element.
Figure 3B:
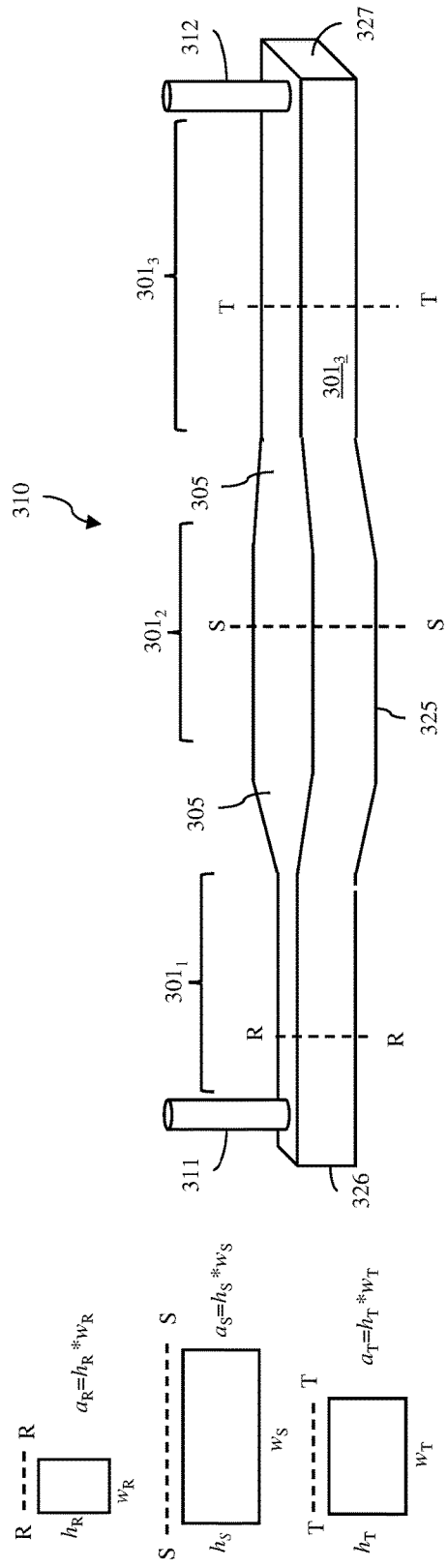
Figure 5:
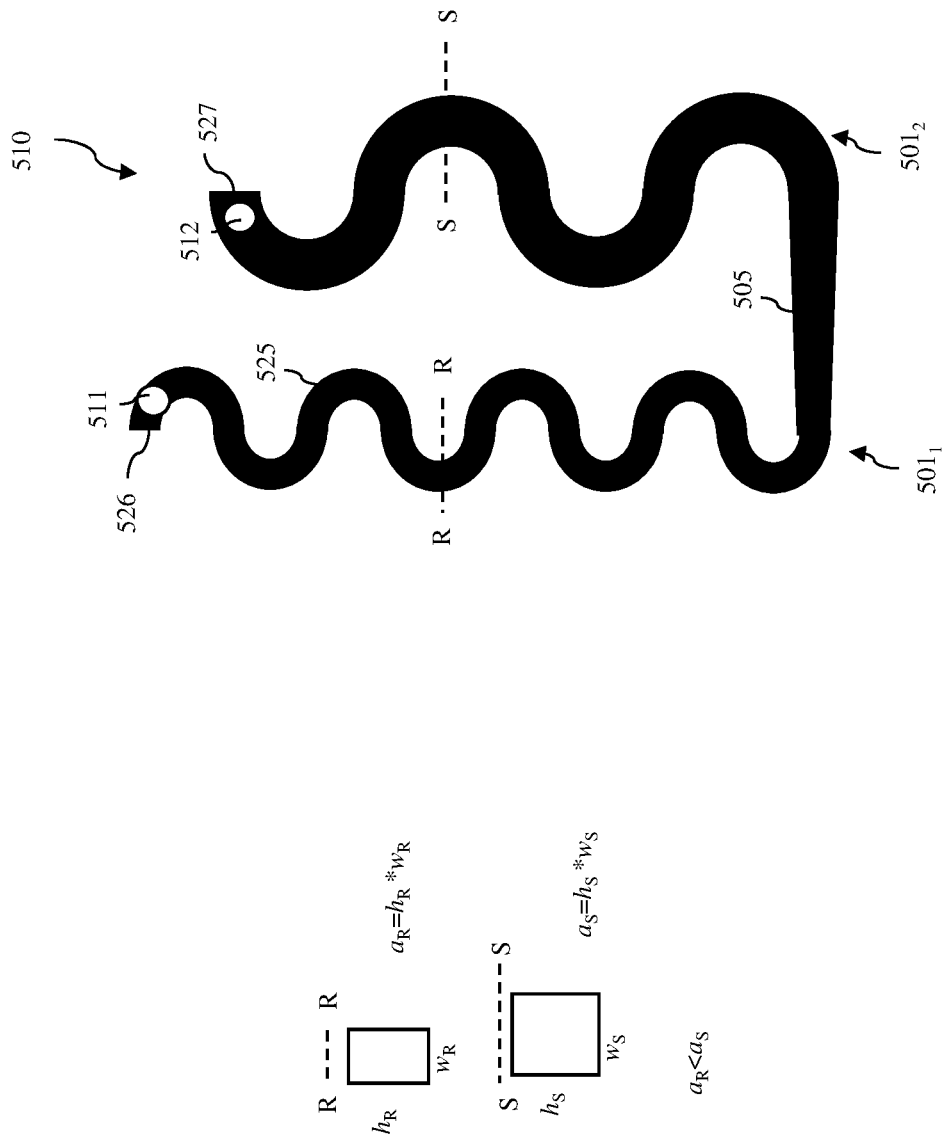
FIG. 5 is a top view drawing illustrating a structure of a heater according to embodiments disclosed herein, wherein the heater has a winding or snake-shaped on-chip heating element.
Figure 6:
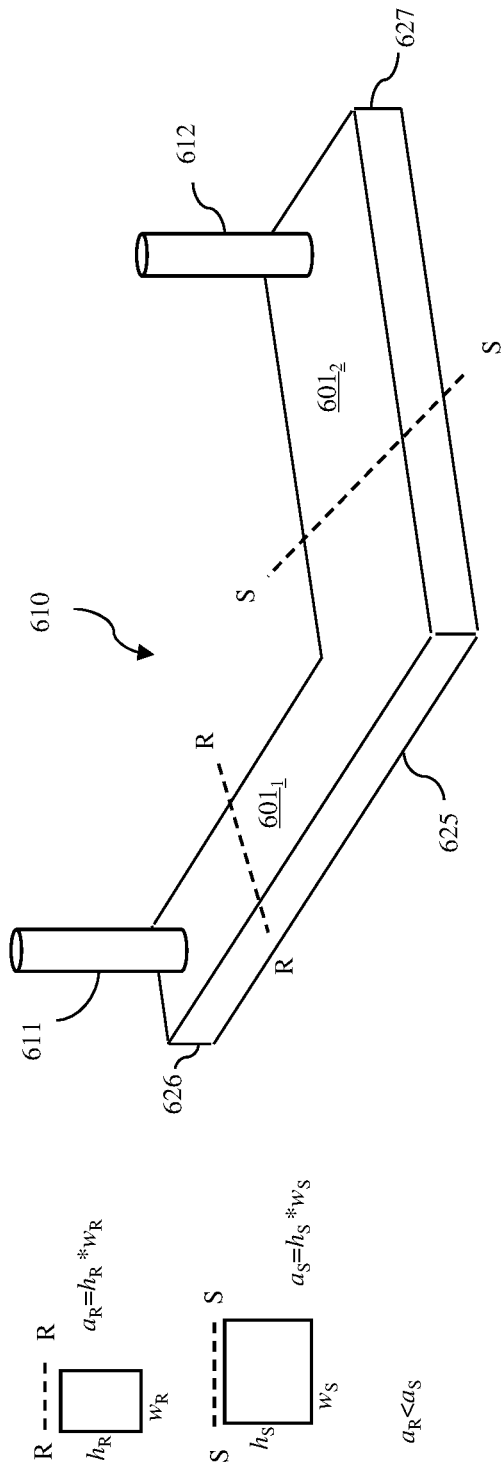
FIG. 6 is a perspective drawing illustrating a structure of a heater according to embodiments disclosed herein, wherein the heater has an essentially L-shaped heating element.

More particularly, disclosed herein are embodiments of a chip structure that includes a heater configured to locally generate different amounts of heat (i.e., to generate different amounts of heat at different locations). This heater can include a heating element. The heating element can specifically be a resistor made of any suitable conductive material through which electric current can flow and be converted into heat energy. For example, the heating element could be a resistor made of a metal or a metal alloy. For example, the heating element could be a patterned metal or metal alloy wire in one of the back end of the line (BEOL) metal levels. Alternatively, the heating element could be a resistor made of a doped semiconductor material. For example, the heating element could be a patterned and doped polysilicon or silicon shape. FIGS. 3A-6 are illustrations of exemplary on-chip heaters that could be incorporated into the disclosed chip structure. Specifically, FIGS. 3A and 3B are perspective drawings illustrating alternative structures, respectively, of a heater 310 with an essentially linear heater element 325. FIGS. 4A and 4B are perspective drawings illustrating alternative structures, respectively, of a heater 410 with an essentially ring-shaped on-chip heating element 425. FIG. 5 is a top view drawing illustrating a structure of a heater 510 with a winding or snake-shaped on-chip heating element 525. FIG. 6 is a perspective drawing illustrating a structure of a heater 610 with an essentially L-shaped heating element 625.

In all such heaters, the heating element 325, 425, 525, 625 can be an elongated structure with a first end 326, 426, 526, 626 and a second end 327, 427, 527, 627. Furthermore, between the first end 326, 426, 526, 626 and the second end 327, 427, 527, 627, the heating element 325, 425, 525, 625 can have two or more different portions with two or more different cross-sectional areas. For example, as illustrated in FIGS. 3A-6, each heating element 325, 425, 525, 625 can have at least one first portion $301_1$, $401_1$, $501_1$, $601_1$ and at least one second portion $301_2$, $401_2$, $501_2$, $601_2$ in series between the first end and the second end. At a point RR in each first portion, the first portion can have a first cross-sectional area ($a_R$), which is equal to the height$_R$ ($h_R$) of the first portion times the width$_R$ (w$_R$) of the first portion at point RR. Furthermore, at a point SS in the second portion, the second portion can have a second cross-sectional area (a$_S$), which is greater than the first cross-sectional area (a$_R$) and which is equal to the heights (h$_S$) of the second portion times the widths (w$_S$) of the second portion at point SS.

It should be noted that, depending upon the specific application and the need to locally generate more than two different amounts of heat, the heating element could include additional portions with different cross-sectional areas than a$_R$ and as, as described above. For example, the heating element could further include at least one third portion also in series between the first end and the second end (e.g., see the third portion 301$_3$ of the heating element 325 of heater 310 shown in FIG. 3B or the third portion 401$_3$ of the heating element 425 of heater 410 shown in FIG. 4B). At a point TT in the third portion, the third portion can have a third cross-sectional area (a$_T$), which is greater than the first cross-sectional area (a$_R$), which is less than the second cross-sectional area (a$_S$), and which is equal to the height$_T$ (h$_T$) of the third portion times the width$_T$ (w$_T$) of the third portion at point TT.

Optionally, the cross-sectional areas of the heating element can taper down at points in any transition region of the heating element between a larger portion of the heating element and an adjacent smaller portion of the heating element (e.g., between a second portion and an adjacent first portion, etc.). See tapered regions 305 in FIGS. 3A-3B, tapered regions 405 in FIGS. 4A-4B, and tapered region 505 in FIG. 5. Alternatively, patterning of the heating element can be such that there is no transition region between larger and smaller portions.

The heater 310, 410, 510, 610 can further include a first terminal 311, 411, 511, 611 at the first end 326, 426, 526, 626 of the heating element 325, 425, 525, 625. Specifically, the first terminal 311, 411, 511, 611 can be, for example, a contact or conductive via landing on the first end 326, 426, 526, 626 of the heating element 325, 425, 525, 625 and further electrically connected to a first voltage source (not shown). Thus, the first terminal 311, 411, 511, 611 can be configured to receive a first voltage from the first voltage source and to apply the first voltage to the first end 326, 426, 526, 626 of the heating element 325, 425, 525, 625.

The heater 310, 410, 510, 610 can further include a second terminal 312, 412, 512, 612 at the second end 327, 427, 527, 627 of the heating element 325, 425, 525, 625. Specifically, the second terminal 312, 412, 512, 612 can be, for example, a contact or conductive via landing on the second end 327, 427, 527, 627 of the heating element 325, 425, 525, 625 and further electrically connected to a second voltage source (not shown). Thus, the second terminal 312, 412, 512, 612 can be configured to receive a second voltage from the second voltage source and to apply the second voltage to the second end 327, 427, 527, 627 of the heating element 325, 425, 525, 625.

The first and second voltage sources can be configured to enable different voltages to be applied to the different ends of the heating element 325, 425, 525, 625 so that current flows through the heating element 325, 425, 525, 625 from end to end. Those skilled in the art will recognize that the direction and amount of current flow (e.g., from the first end to the second end or from the second end to the first end) will depend upon the voltage differential. In any case, current flowing through the heating element 325, 425, 525, 625 will cause the heating element to generate heat. However, due to the different cross-sectional areas of the different portions, the current densities through those different portions will be different and, thus, the different portions of the heating element will generate different amounts of heat per unit length. More specifically, the current densities through portions with larger cross-sectional areas will be smaller than the current densities through portions with smaller cross-sectional areas. As a result, the portions with larger cross-sectional areas will generate less heat per unit length than the portions with smaller cross-sectional areas.

In the exemplary heating elements 325, 425, 525, 625, since the first cross-sectional area (a$_R$) associated with each first portion 301$_1$, 401$_1$, 501$_1$, 601$_1$ is less than the second cross-sectional area (a$_S$) associated with each second portion 301$_2$, 401$_2$, 501$_2$, 601$_2$, a first current density through each first portion 301$_1$, 401$_1$, 501$_1$, 601$_1$ will be greater than a second current density through each second portion 301$_2$, 401$_2$, 501$_2$, 601$_2$. As a result, each first portion 301$_1$, 401$_1$, 501$_1$, 601$_1$ will generate a first amount of heat per unit length and each second portion 301$_2$, 401$_2$, 501$_2$, 601$_2$ will generate a second amount of heat per unit length that is less than the first amount. In the exemplary heating elements that include a third portion associated with a third cross-sectional area (a$_T$) that is between the cross-sectional areas a$_R$ and as (e.g., see the third portion 301$_3$ of FIG. 3B or third portion 401$_3$ of FIG. 4B, the third current density through the third portion will be less than the first current density through each first portion and greater than the second current density through each second portion. As a result, each third portion will generate a third amount of heat per unit length that is between the first and second amounts.

It should be noted that the heater structures described in detail above and shown in FIGS. 3A-3B, 4A-4B, 5 and 6, respectively, are provided to show key features of the present invention (e.g., a heater with a heating element having different portions with different cross-sectional areas for locally generating different amounts of heat) and to show that such a heating element could have any one of a variety of different shapes to create different current paths. That is, the shape of the heating element defines the path of the current as it flows between the terminals. For example, in the heating element 325 of the heater 310 of FIG. 3A or 3B, the current path between the terminals 311 and 312 is a straight line (i.e., essentially linear). In the heating element 425 of the heater 410 of FIG. 4A or 4B, the current path between the terminals 411 and 412 approaches a circle or ring. In the heating element 525 of the heater 510 of FIG. 5, the current path between the terminals 511 and 512 is winding. It should be understood that the heating element could have some other shape (e.g., a spiral shape, a U-shape, etc.) to define some other current path (e.g., a spiral current path, a U-shaped current path, etc.).

The above-described heater and, particularly, the heating element thereof can be designed and placed on-chip to facilitate local thermal tuning of adjacent areas of the chip (e.g., local thermal tuning of different regions of a single device on the chip or, alternatively, local thermal tuning of multiple devices) without requiring multiple different heaters within a relatively small chip area. The device or devices could be any type of on-chip device in which a performance characteristic is enhanced or adjusted thermal tuning. The device or devices could be photonic device(s) (e.g., waveguides, couplers, resonators, modulators, filters, etc.), optoelectronic device(s) (e.g., photodiodes, phototransistors, light emitting diodes, etc.) or electronic device(s) (e.g., diodes, transistors, etc.). Such devices are well known in the art and, thus, the details thereof are omitted from this specification to allow the reader to focus on the salient aspects of the disclosed embodiments. The device or devices can be active or passive device(s). If/when multiple devices are to be heated by the same heater, the devices could be any combination of photonic, optoelectronic, electronic, active or passive devices. The device or devices can be semiconductor device(s) comprising any of silicon (Si), germanium (Ge), gallium (Ga), arsenic (As), nitrogen (N), or an alloy thereof or any other suitable material employed for use in semiconductor devices. The design of the heating element will be dictated by the specific chip design and, particularly, by the shape, placement, and thermal tuning requirements of the device or devices to be heated by the heater. Additionally, the heater will be placed adjacent so that the different portions of the heater can apply different amounts of heat to different regions of the device or to different devices. For purposes of illustration, the heater is shown in the figures as being aligned with and placed above the device or devices to be thermally tuned. However, it should be understood that the figures are not intended to be limiting and that, alternatively, the heater could be placed to the side (i.e., at the same level) or below) the device or devices to be thermally tuned. For example, the heating element could be a resistor embedded in the substrate below the device or devices to be thermally tuned, could be a resistor at the same device layer as device or devices to be tuned, or could be a resistor in a metal layer about the device or devices to be tuned.

Figure 7:
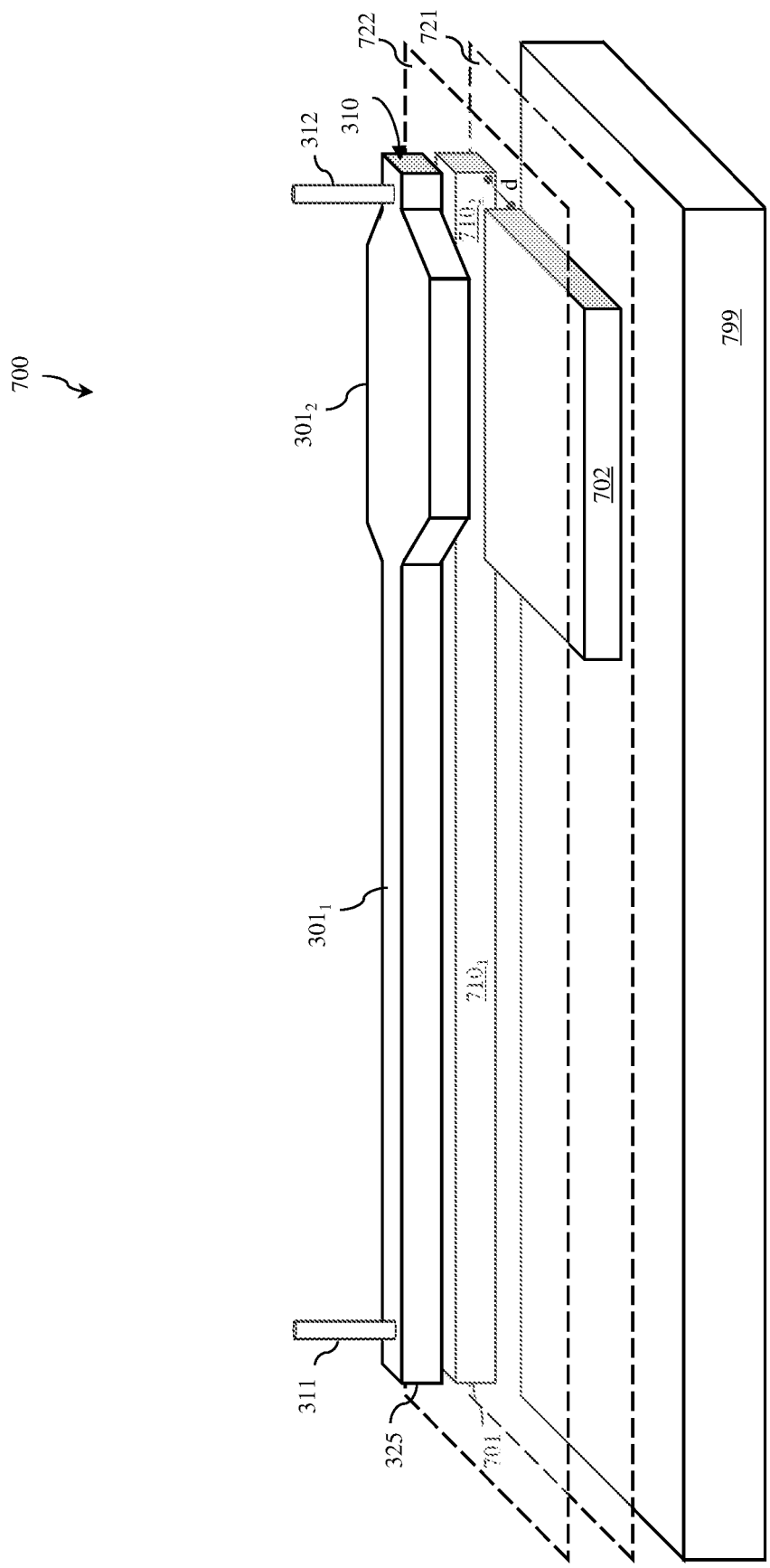
FIGS. 7 and 8 are perspective drawings illustrating exemplary chip structures according to embodiments disclosed herein, wherein an on-chip heater is configured for local thermal tuning of different regions of an on-chip device.
Figure 8:
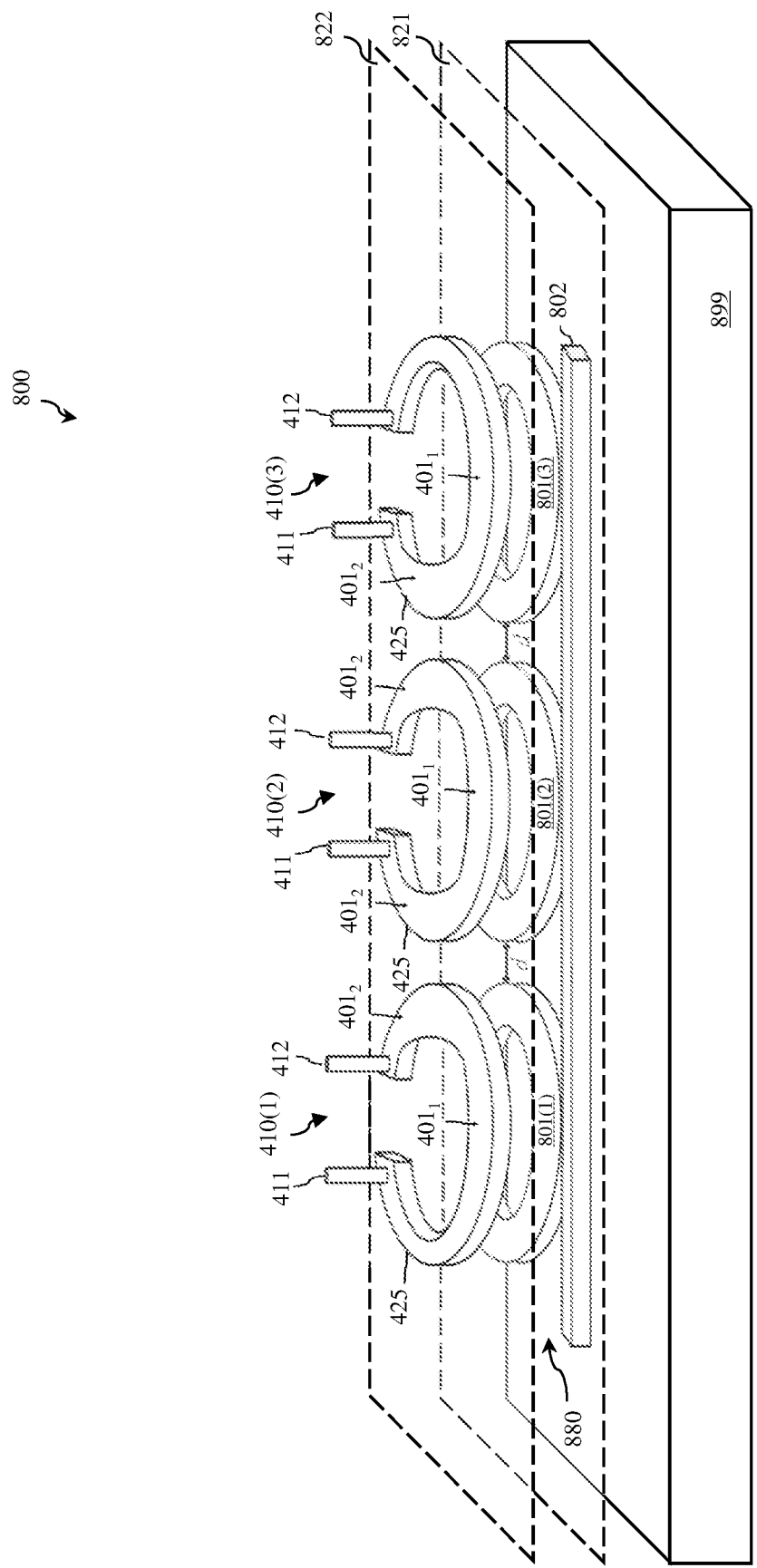

FIGS. 7 and 8 are perspective drawings illustrating exemplary chip structures 700 and 800, respectively, each including a device 701, 801 that requires thermal tuning and a heater with a heating element adjacent to the device (e.g., above the device) and configured to facilitate local thermal tuning of different regions of the device 701, 801.

More specifically, FIG. 7 shows a chip structure 700 that includes a substrate 799 and, on the substrate 799, various fabrication levels including, but not limited to, a front end of the line (FEOL) device level, a middle of the line (MOL) contact level, and back end of the line (BEOL) metal levels. The transparent planes 721 and 722 represent two different fabrication levels. These two different fabrication levels could be, for example, a device level 721, which includes one or more devices (as discussed in greater detail below), and a metal level 722, which is some distance above the device level 721 and which includes a heater (as discussed in greater detail below). It should be noted that in order to allow the reader to focus on the salient aspects of the disclosed embodiments specifically related to device and heater alignment, all other fabrication levels (e.g., any levels above, below or in between the levels 721-722) have been omitted from the drawings.

The chip structure 700 can further include two or more devices, including a device 701 and an additional device 702, in the device level 721. The device 701 can be an essentially linear optical waveguide or some other linear device that requires thermal tuning to achieve a predetermined temperature and uniform temperature distribution (e.g., the same predetermined temperature across the length of the device 701). The device 701 can further have two regions: a first region $710_1$ and a second region $710_2$. The additional device 702 (e.g., another optical waveguide or some other heat generating device) can be positioned in close proximity (e.g., within some distance (d)) to the second region $710_2$ of the device 701 such that a first pre-thermal tuning temperature of the first region $710_1$ of the device 701 is less than a second pre-thermal tuning temperature of the second region $710_2$. That is, due to the placement of the additional device 702 relative to the second region $710_2$ of the device 701, temperatures variations are present across the first and second regions of the device 701 prior to any thermal tuning. It should be noted that in order to allow the reader to focus on the salient aspects of the disclosed embodiments specifically related to device and heater alignment, additional features of the device level 721 have been omitted from the drawings. For example, these additional device level features can include, but are not limited to, other devices, cladding material layer(s) (e.g., covering any waveguides), sidewall spacers, one or more layer(s) of dielectric material (e.g., covering all the devices), etc.

The chip structure 700 can further include a heater in the metal level 722. For example, the chip structure 700 can include an instance of the heater 310 described in detail above and illustrated in FIG. 3A. In this chip structure 700, the heating element 325 of the heater 310 and the device 701 can have approximately equal lengths and the heater 310 can be placed such that the heating element 325 is aligned with the device 701. Additionally, the heating element 325 can include different portions with different cross-sectional areas and the different portions can be aligned with different regions of the device 701 that have different temperature profiles. That is, the heating element 325 can include, adjacent to the first region $710_1$ of the device 701, a first portion $301_1$ with a first cross-sectional area ($a_R$) and, adjacent to the second region $710_2$ of the device 701 that runs hotter, a second portion $301_2$ with a second cross-sectional area ($a_S$) that is greater than the first cross-sectional area ($a_R$). In this case, the different portions $301_1$ and $301_2$ of the heating element 325 can be configured so that the resulting different amounts of heat, which are generated by the different portions of the heating element 325 and applied to the different regions $710_2$-$710_2$ of the device 701, are sufficient to achieve the predetermined temperature and uniform temperature distribution (e.g., the same predetermined temperature across the length of the device 701). It should be noted that in order to allow the reader to focus on the salient aspects of the disclosed embodiments specifically related to device and heater alignment, additional features of the metal level 722 have been omitted from the drawings. For example, in the metal level 722, the heating element 325 can be formed within a trench, which has been patterned into one or more layer(s) of interlayer dielectric (ILD) material, and can further be covered by one or more layer(s) of ILD material. In any case, the chip structure 700 can be configured such that the material(s) and the distance between the heating element and the device ensure that the device is thermally coupled to, but electrically isolated from, the heating element.

Similarly, FIG. 8 shows a chip structure 800 that includes a substrate 899 and, on the substrate 899, various fabrication levels including, but not limited to, a front end of the line (FEOL) device level, a middle of the line (MOL) contact level, and back end of the line (BEOL) metal levels. The transparent planes 821 and 822 represent two different fabrication levels. These two different fabrication levels could be, for example, a device level 821, which includes one or more devices (as discussed in greater detail below), and a metal level 822, which is some distance above the device level 821 and which includes a heater (as discussed in greater detail below). It should be noted that in order to allow the reader to focus on the salient aspects of the disclosed embodiments specifically related to device and heater alignment, all other fabrication levels (e.g., any levels above, below or in between the levels 821-822) have been omitted from the drawings.

The chip structure 800 can include an optical resonator 880 in the device level 821. The optical resonator 880 can include two or more ring-shaped waveguides (e.g., see first, second and third ring-shaped waveguides 801(1)-801(3)) and a linear waveguide 802 adjacent to the ring-shaped waveguides 801(1)-801(3). Each ring-shape waveguide 801(1)-801(3) requires thermal tuning to some predetermined temperature and uniform temperature distribution (e.g., the same predetermined temperature across the length of the ring-shaped waveguide). In this example, each ring-shaped waveguide 801(1)-801(3) has different regions with different pre-thermal tuning temperature variations due to close proximity (e.g., within some distance (d)) to the other ring-shaped waveguides. It should be noted that in order to allow the reader to focus on the salient aspects of the disclosed embodiments specifically related to device and heater alignment, additional features of the device level 821 have been omitted from the drawings. For example, these additional device level features can include, but are not limited to, other devices, cladding material layer(s) (e.g., covering the waveguides), sidewall spacers, one or more layer(s) of dielectric material (e.g., covering all of the devices), etc.

The chip structure 800 can further include, in the metal level 822, two or more heaters for the two or more ring-shaped waveguides. For example, the chip structure 800 can include multiple instances of the heater 410 shown in FIG. 4A or 4B and described above (e.g., see first, second and third heaters 410(1)-410(3)). In this chip structure 800, each heater 410(1)-410(3) can be placed such that a heating element 425 is aligned with a corresponding ring-shaped waveguide 801(1)-801(3). The heating element 425 can include different portions with different cross-sectional areas and the different portions can be adjacent to different regions of the ring-shaped waveguide below that have different temperature profiles. That is, in the first heater 410(1), the heating element 425 can include, adjacent to a first region of the first ring-shaped waveguide 801(1), a first portion $401_1$ with a first cross-sectional area ($a_R$) and, adjacent to a second region of the first ring-shaped waveguide 801(1) that runs hotter due to close proximity to the second ring-shaped waveguide 801(2), a second portion $401_2$ with a second cross-sectional area ($a_S$) that is greater than the first cross-sectional area ($a_R$). In the second heater 410(2), the heating element 425 can include, adjacent to first regions of the second ring-shaped waveguide 801(2), first portions $401_1$ with a first cross-sectional area ($a_R$) and, adjacent to second regions of the second ring-shaped waveguide 801(2) that run hotter due to close proximity to the first and third ring-shaped waveguides 801(1) and 801(3), second portions $401_2$ with a second cross-sectional area ($a_S$) that is greater than the first cross-sectional area ($a_R$). In the third heater 410(3), the heating element 425 can include, adjacent to a first region of the third ring-shaped waveguide 801(3), a first portion $401_1$ with a first cross-sectional area ($a_R$) and, adjacent to a second region of the third ring-shaped waveguide 801(3) that runs hotter due to close proximity to the second ring-shaped waveguide 801(2), a second portion $401_2$ with a second cross-sectional area ($a_S$) that is greater than the first cross-sectional area ($a_R$). In each heater 410(1)-410(3), due to placement of the heating element relative to the ring-shaped waveguide below and, particularly, due to alignment of the different portions of the heating element with the different regions of the waveguide below, different amounts of heat can be applied to the different regions of the waveguide below, thereby raising the temperatures of those regions by different amounts. Thus, in each of the heaters 410(1)-410(3), the different portions $401_1$ and $401_2$ of the heating element 425 can be configured so that the resulting different amounts of heat, which are generated by the different portions of the heating element 425 and applied to the different regions of the ring-shaped waveguide below, are sufficient to achieve the predetermined temperature and uniform temperature distribution (e.g., the same predetermined temperature across the length of the ring-shaped waveguide). It should be noted that in order to allow the reader to focus on the salient aspects of the disclosed embodiments specifically related to device and heater alignment, additional features of the metal level 822 have been omitted from the drawings. For example, in the metal level 822, the heating elements 425 of the heaters 410(1)-410(3) can be formed within corresponding trenches, which have been patterned into one or more layer(s) of interlayer dielectric (ILD) material, and can further be covered by one or more layer(s) of ILD material. In any case, the chip structure 800 can be configured such that the materials and distance between the ring-shaped waveguide(s) and the heating element(s) ensure that each ring-shaped waveguide is thermally coupled to, but electrically isolated from, a heating element.

Figure 9:
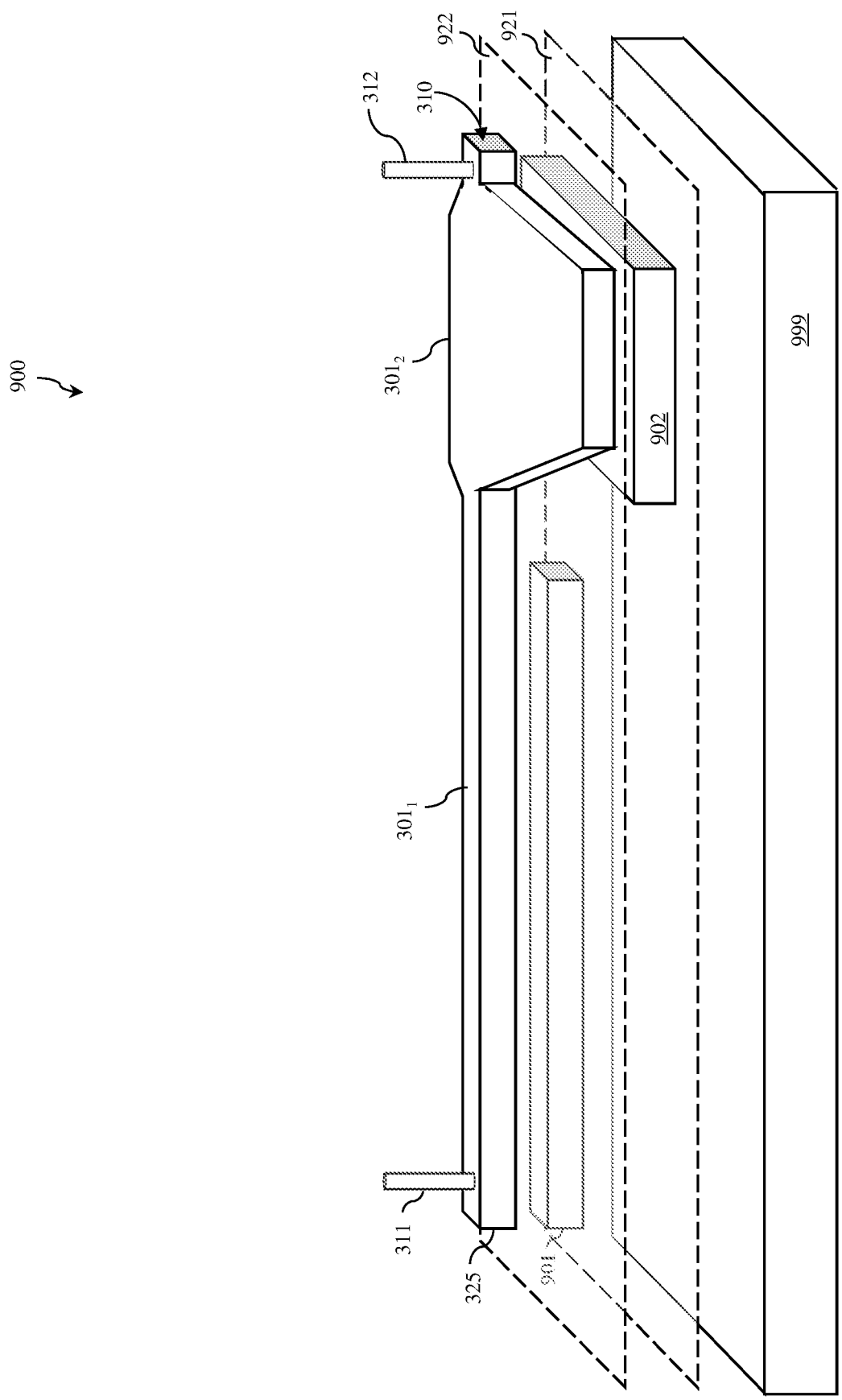
FIG. 9 is a perspective drawing illustrating an exemplary chip structure according to embodiments disclosed herein, wherein an on-chip heater is configured for local thermal tuning of different on-chip devices.

FIG. 9 is a perspective drawing illustrating an exemplary chip structure 900 that includes multiple devices that require thermal tuning and a heater with a heating element adjacent to the devices (e.g., above the devices) and configured to facilitate local thermal tuning. Specifically, the chip structure 900 can include a substrate 999 and, on the substrate 999, various fabrication levels including, but not limited to, a front end of the line (FEOL) device level, a middle of the line (MOL) contact level, and back end of the line (BEOL) metal levels. The transparent planes 921 and 922 represent two different fabrication levels. These two different fabrication levels could be, for example, a device level 921, which includes one or more devices (as discussed in greater detail below), and a metal level 922, which is some distance above the device level 921 and which includes a heater (as discussed in greater detail below). It should be noted that in order to allow the reader to focus on the salient aspects of the disclosed embodiments specifically related to device and heater alignment, all other fabrication levels (e.g., any levels above, below or in between the levels 921-922) have been omitted from the drawings.

The chip structure 900 can include, within the device level 921, two or more devices including a first device 901 and a second device 902 adjacent to the first device 901. It should be noted that in order to allow the reader to focus on the salient aspects of the disclosed embodiments specifically related to device and heater alignment, additional features of the device level 921 have been omitted from the drawings. For example, these additional device level features can include, but are not limited to, other devices, cladding material layer(s) (e.g., covering any waveguides), sidewall spacers, one or more layer(s) of dielectric material (e.g., covering all the devices), etc.

The chip structure 900 can further include, within the metal level 922, a heater. For example, the chip structure 900 can include an instance of the heater 310 described in detail above and illustrated in FIG. 3A. In this chip structure 900, the heating element 325 of the heater 310 can be placed such that the heating element 325 extends over both the first device 901 and the second device 902. Additionally, the heating element 325 can include different portions with different cross-sectional areas and the different portions can be aligned with the different devices 901 and 902. That is, the heating element 325 can include, adjacent to the first device 901, a first portion $301_1$ with a first cross-sectional area ($a_R$) and, adjacent to the second device 902, a second portion $301_2$ with a second cross-sectional area ($a_S$) that is greater than the first cross-sectional area ($a_R$). Due to placement of the heating element relative to the different devices 901-902 and, particularly, due to alignment of the different portions of the heating element with the different devices, different amounts of heat can be applied to the different devices, thereby raising the temperatures of the different devices 901-902 by different amounts. In this case, the different portions $301_1$ and $301_2$ of the heating element 325 can be configured so that thermal tuning results in the same or different predetermined temperature profiles in the different devices 901-902. It should be noted that in order to allow the reader to focus on the salient aspects of the disclosed embodiments specifically related to device and heater alignment, additional features of the metal level 922 have been omitted from the drawings. For example, in the metal level 922, the heating element 325 can be formed within a trench, which has been patterned into one or more layer(s) of interlayer dielectric (ILD) material, and can further be covered by one or more layer(s) of ILD material. In any case, the chip structure 900 can be configured such that the material(s) and distance between the heating element and the devices ensure that the devices are thermally coupled to, but electrically isolated from, the heating element.

Again, it should be understood that the figures are not intended to be limiting. While FIGS. 7-9 illustrate heater(s) in a metal level and aligned above device(s) in a device level, alternatively, the heater could be placed to the side (i.e., at the same level) or below) the device or devices to be thermally tuned. For example, the heating element could be a resistor embedded in the substrate below the device or devices to be thermally tuned, could be a resistor at the same device layer as device or devices to be tuned, or could be a resistor in a metal layer about the device or devices to be tuned. In any case, those skilled in the art will recognize such a chip structure can further include a temperature control system with on-chip temperature sensor(s), the voltage sources, and a controller in communication with the on-chip temperature sensors and the voltage sources. In such a system, the actual temperatures at locations requiring thermal tuning can be periodically or continuously sensed by the sensor(s) and, based on the actual temperature(s), the controller can cause the voltage sources to selectively adjust the voltage differential between the first and second terminals of the heater and, thereby the current flow and the amount of heat generated by the different portions of the heating element so as to maintain a particular temperature profile in the device or devices subject to thermal tuning using the heater.

Figure 10:
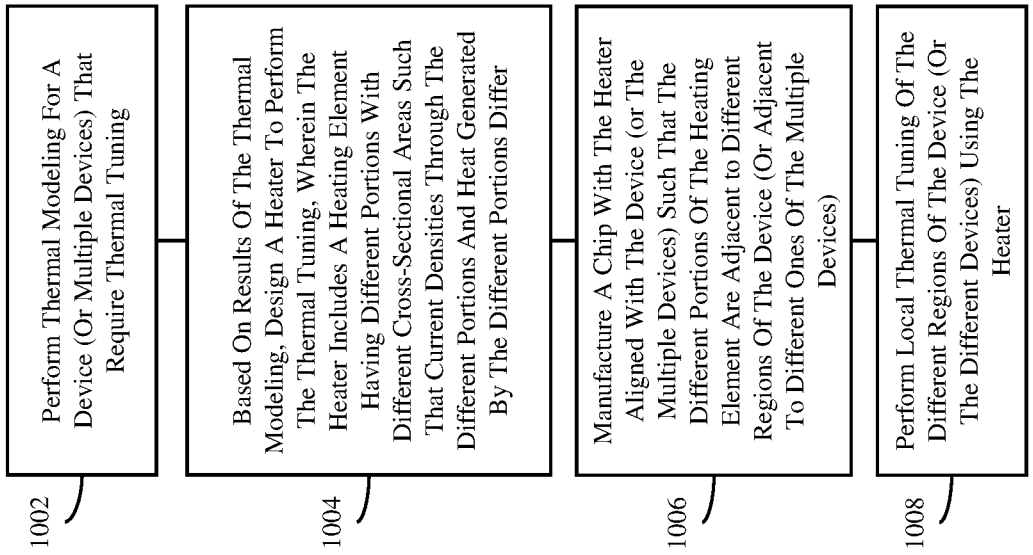
FIG. 10 is a flow diagram illustrating disclosed method embodiments.

Referring to the flow diagram of FIG. 10, also disclosed herein are method embodiments associated with the above-described structures. The method embodiments can include performing thermal modeling for a device that requires thermal tuning (or, alternatively, for multiple devices that require thermal tuning) (see process step 1002). The device or devices could be any type of on-chip device in which a performance characteristic is enhanced or adjusted by thermal tuning. The device or devices could be photonic device (s) (e.g., waveguides, couplers, resonators, modulators, filters, etc.), optoelectronic device(s) (e.g., photodiodes, phototransistors, light emitting diodes, etc.) or electronic device(s) (e.g., diodes, transistors, etc.). The device or devices can be active or passive device(s). The device or devices can be semiconductor device(s) comprising any of silicon (Si), germanium (Ge), gallium (Ga), arsenic (As), nitrogen (N), or an alloy thereof or any other suitable material employed for use in semiconductor devices. Such devices are well known in the art and, thus, the details thereof are omitted from this specification to allow the reader to focus on the salient aspects of the disclosed embodiments. In any case, such thermal modeling can be performed, for example, to predict the operating temperature of each device and to predict any in-device temperature variations that will be present (e.g., due to close proximity to other on-chip devices). Techniques for thermal modeling are well known in the art and, thus, a discussion of these techniques is omitted from this specification in order to allow the reader to focus on the disclosed embodiments.

The method can further include, based on the results of the thermal modeling, designing an on-chip heater to perform local thermal tuning of adjacent areas of the chip (see process step 1004). For example, the on-chip heater could be designed to perform local thermal tuning of different regions of a single device (or, alternatively, to perform local thermal tuning of different devices). The on-chip heater can specifically be designed, as discussed in detail above with regard to the chip structure embodiments, so that it includes a heating element (e.g., a resistor) configured to locally generate different amounts of heat (i.e., to generate different amounts of heat at different locations). That is, as described above and illustrated in FIG. 3A-3B, 4, 5 or 6, such a heater can include a heating element with a first end and a second end and, between the first end and the second end, different portions with different cross-sectional areas such that current densities through the different portions will be different and, thus, such that heat per unit length generated by the different portions will be different. The heater can further include a first terminal at the first end of the heating element and a second terminal at the second end of the heating element. The design of the heating element will be dictated by the specific chip design and, particularly, by the shape, placement, and thermal tuning requirements of the device or devices to be heated by the heater.

The method can further include manufacturing a chip that includes the heater and, adjacent to the heater, the device to be thermally tuned using the heater (or, alternatively, the devices to be thermally tuned using the heater) (see process step 1006). Specifically, at process step 1006 during manufacture of the chip, the heater can be manufactured so that the different portions of the heating element with the different cross-sectional areas are adjacent to different regions of the device that will require different amounts of heat during thermal tuning (or, alternatively, so that the different portions of the heating element with the different cross-sectional areas are adjacent to different devices that will require different amounts of heat during thermal tuning). For purposes of illustration, the heater is shown in the figures as being aligned with and placed above the device or devices to be thermally tuned. However, it should be understood that the figures are not intended to be limiting and that, alternatively, the heater could be placed to the side (i.e., at the same level) or below) the device or devices to be thermally tuned. For example, the heating element could be a resistor embedded in the substrate below the device or devices to be thermally tuned, could be a resistor formed in the same device layer as device or devices to be tuned, or could be a resistor formed in a metal layer about the device or devices to be tuned.

The method embodiments can further include performing local thermal tuning of the different portions of the device (or, alternatively, of the different devices) using the heater (see process step 1008). Specifically, process step 1008 can include applying a first voltage to the first terminal and a second voltage, which is different from the first voltage, to the second terminal to as to cause current to flow through the heating element. Current flowing through the heating element causes the heating element to generate heat. However, due to the different cross-sectional areas of the different portions of the heating element, the current densities through those different portions are different and, thus, the different portions of the heating element generate different amounts of heat per unit length. Generation of heat using the heater can be performed so that the different amounts of heat per unit length generated by the different portions of the heating element raise the temperatures of the different regions of the device (or, alternatively, the different devices) by different amount. Raising the temperatures of the different regions of the device (or, alternatively, the different devices) by different amounts can, for example, be performed in order to achieve an essentially uniform temperature distribution across the different regions of the device (or, alternatively, across the different devices). Alternatively, raising the temperatures of the different regions of the device (or, alternatively, the different devices) by different amounts could be performed in order to achieve different temperature profiles across the different regions of the device (or, alternatively, across the different devices).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a heating element with a first end and a second end and, between the first end and the second end, different portions with different cross-sectional areas, wherein the different portions overlay any of different devices and different regions of a single device and are configured to raise, by different amounts, temperatures of the different devices or the different regions of the single device and wherein the different portions are configured so that raising the temperatures by the different amounts results in an essentially uniform temperature distribution across the different devices or the different regions of the single device;
   a first terminal at the first end and configured to receive a first voltage; and
   a second terminal at the second end and configured to receive a second voltage that is different from the first voltage so that current flows through the heating element.

2. The structure of claim 1,
   wherein the different portions comprise at least: a first portion with a first cross-sectional area; and a second portion with a second cross-sectional area that is greater than the first cross-sectional area such that a first current density through the first portion is greater than a second current density through the second portion, and
   wherein, due to the first current density being larger than the second current density, the first portion generates a first amount of heat per unit length and the second portion generates a second amount of heat per unit length that is less than the first amount of heat per unit length.

3. The structure of claim 1, wherein the heating element comprises any of a metal, a metal alloy and a doped semiconductor.

4. The structure of claim 1, wherein the heating element provides a linear current path between the first terminal and the second terminal.

5. The structure of claim 1, wherein the heating element provides a non-linear current path between the first terminal and the second terminal.

6. The structure of claim 1, further comprising multiple devices comprising any of semiconductor, photonic, optoelectronic, and electronic devices.

7. A structure comprising:
an optical resonator comprising a plurality of ring-shaped waveguides; and
a plurality of heaters, each heater over a corresponding ring-shaped waveguide and each heater comprising:
a heating element comprising: a first end and a second end and, between the first end and the second end, different portions with different cross-sectional areas aligned over different regions of a corresponding ring-shaped waveguide;
a first terminal at the first end and configured to receive a first voltage; and
a second terminal at the second end and configured to receive a second voltage that is different from the first voltage so that current flows through the heating element, wherein the first and second terminals are over the device,
wherein the different portions comprise at least: a first portion with a first cross-sectional area; and a second portion with a second cross-sectional area that is greater than the first cross-sectional area such that a first current density through the first portion is greater than a second current density through the second portion,
wherein, due to the first current density being larger than the second current density, the first portion generates a first amount of heat per unit length and the second portion generates a second amount of heat per unit length that is less than the first amount of heat per unit length,
wherein each ring-shaped waveguide has a first region with a first pre-thermal tuning temperature aligned below the first portion of its corresponding heating element and a second region with a second pre-thermal tuning temperature aligned below the second portion of that same heating element,
wherein each waveguide has an adjacent waveguide that is closer to the second region than the first region and, as a result, the second pre-thermal tuning temperature of the second region is greater than the first pre-thermal tuning temperature of the first region, and
wherein the first portion and the second portion of each heating element are configured to raise temperatures of the first region and the second region by different amounts so as to achieve an essentially uniform temperature distribution across the first region and the second region of the ring-shaped waveguides.

8. The structure of claim 7, wherein the heating element comprises any of a metal, a metal alloy, and a semiconductor.

9. The structure of claim 7, further comprising a linear waveguide positioned laterally adjacent to the plurality of ring-shaped waveguides.

10. A method comprising:
providing a chip structure comprising a heater comprising: a heating element with a first end and a second end and, between the first end and the second end, different portions with different cross-sectional areas, wherein the different portions overlay any of different devices and different regions of a single device and are configured to raise, by different amounts, temperatures of the different devices or the different regions of the single device and wherein the different portions are configured so that raising the temperatures by the different amounts results in an essentially uniform temperature distribution across the different devices or the different regions of the single device; a first terminal at the first end; and a second terminal at the second end; and
generating heat using the heater, wherein the generating of the heat comprises: applying a first voltage to the first terminal and a second voltage that is different from the first voltage to the second terminal so as to cause current to flow through the heating element, wherein, due to the different cross-sectional areas, as the current flows through the different portions of the heating element, different amounts of heat per unit length are locally generated by the different portions.

11. The method of claim 10,
wherein the different portions comprise at least: a first portion with a first cross-sectional area; and a second portion with a second cross-sectional area that is greater than the first cross-sectional area such that a first current density through the first portion is greater than a second current density through the second portion, and
wherein, due to the first current density being larger than the second current density, the first portion generates a first amount of heat per unit length and the second portion generates a second amount of heat per unit length that is less than the first amount of heat per unit length.

12. The structure of claim 1, wherein the heating element has a serpentine shape.

13. The structure of claim 7, wherein the heating element has a serpentine shape.

14. The structure of claim 1, further comprising an additional heating element adjacent the heating element, the additional heating elements having a first end and a second end and, between the first end and the second end, different portions with different cross-sectional areas,
wherein the first portion and the second portion of each heating elements are configured to raise temperatures of a first region and a second region of the different devices or the different regions of the single device by different amounts so as to achieve an essentially uniform temperature distribution across the first region and the second region of the different devices or the different regions of the single device.

15. The method of claim 10, further comprising an additional heating element adjacent the heating element, the additional heating elements having a first end and a second end and, between the first end and the second end, different portions with different cross-sectional areas,
wherein the first portion and the second portion of each heating elements are configured to raise temperatures of a first region and a second region of the different devices or the different regions of the single device by different amounts so as to achieve an essentially uniform temperature distribution across the first region and the second region of the different devices or the different regions of the single device.

* * * * *